United States Patent
Goto et al.

(10) Patent No.: US 8,278,249 B2
(45) Date of Patent: Oct. 2, 2012

(54) COMPOSITION FOR FORMING THICK OXIDE SUPERCONDUCTOR FILM AND PROCESS FOR PRODUCING THICK TAPE-SHAPED OXIDE SUPERCONDUCTOR FILM

(75) Inventors: Tomotaka Goto, Tokyo (JP); Atsuya Yoshinaka, Tokyo (JP); Akimasa Yajima, Tokyo (JP)

(73) Assignee: Adeka Corporation, Tokyo (JP)

( * ) Notice: Subject to any disclaimer, the term of this patent is extended or adjusted under 35 U.S.C. 154(b) by 0 days.

(21) Appl. No.: 13/132,512

(22) PCT Filed: Jan. 6, 2010

(86) PCT No.: PCT/JP2010/050061
§ 371 (c)(1),
(2), (4) Date: Jun. 2, 2011

(87) PCT Pub. No.: WO2010/092841
PCT Pub. Date: Aug. 19, 2010

(65) Prior Publication Data
US 2011/0237440 A1  Sep. 29, 2011

(30) Foreign Application Priority Data
Feb. 16, 2009 (JP) .................................. 2009-032490

(51) Int. Cl.
*H01L 39/12* (2006.01)
*C04B 35/45* (2006.01)

(52) U.S. Cl. .......................... 505/125; 505/445; 505/470

(58) Field of Classification Search .................. 505/125, 505/126, 434, 445, 446, 500; 427/62
See application file for complete search history.

(56) References Cited

U.S. PATENT DOCUMENTS
| | | | |
|---|---|---|---|
| 5,231,074 A | 7/1993 | Cima et al. | |
| 5,650,362 A * | 7/1997 | Nashimoto | ................ 427/126.3 |
| 5,656,382 A * | 8/1997 | Nashimoto | ................... 428/620 |
| 2002/0076567 A1 | 6/2002 | Honjo et al. | |
| 2006/0043347 A1 | 3/2006 | Tetsuji et al. | |

FOREIGN PATENT DOCUMENTS
| | | |
|---|---|---|
| JP | 63-277770 | 11/1988 |
| JP | 2004-161505 | 6/2004 |
| JP | 2008-169059 | 7/2008 |

OTHER PUBLICATIONS
International Search Report, PCT/JP2010/050061, Apr. 13, 2010.

* cited by examiner

*Primary Examiner* — Colleen Dunn
(74) *Attorney, Agent, or Firm* — Young & Thompson

(57) ABSTRACT

Disclosed is a composition for forming a thick oxide superconductor film, the oxide being an RE-BA—Cu based oxide, wherein RE is at least one element selected from the group consisting of Y, Nd, Sm, Gd, Eu, Yb, Pr, and Ho. The composition contains an RE salt of a keto acid having 4 to 8 carbon atoms as an RE component, barium trifluoroacetate as a Ba component, at least one copper salt selected from the group consisting of a copper salt of a branched saturated aliphatic carboxylic acid having 6 to 16 carbon atoms and a copper salt of an alicyclic carboxylic acid having 6 to 16 carbon atoms as a Cu component, and an organic solvent dissolving these metal salt components. In the composition, the RE to Ba to Cu molar ratio is 1:1.3 to 2.2:2.4 to 3.6 and the content of the organic solvent is 25% to 80% by weight.

17 Claims, No Drawings

COMPOSITION FOR FORMING THICK OXIDE SUPERCONDUCTOR FILM AND PROCESS FOR PRODUCING THICK TAPE-SHAPED OXIDE SUPERCONDUCTOR FILM

TECHNICAL FIELD

This invention relates to a composition for forming a thick superconductor film of an RE-Ba—Cu (RE is at least one element selected from the group consisting of Y, Nd, Sm, Gd, Eu, Yb, Pr, and Ho) based oxide and a process of producing a thick tape-shaped oxide superconductor film using the composition. The composition is suitable to a wet deposition method in which a precursor composition applied on a substrate is heated and/or fired to form ceramic (hereinafter sometimes referred to as an MOD method) and capable of fabricating a uniform film at a high speed.

BACKGROUND ART

Oxide superconductors, the critical temperature (Tc) of which exceeds liquid nitrogen temperature, have been under extensive studies in expectation of application to wires and devices.

In order for an oxide superconductor to be applied to wires, it is necessary to produce an oxide superconductor having a high critical current density (Jc) and a continuous length. To produce a continuous length oxide superconductor of tape form, an oxide superconductor must be formed on a metal tape from the viewpoint of strength and flexibility.

Because an oxide superconductor is crystallographically anisotropy, it is required to establish a deposition technique in which an oxide superconductor is allowed to grow epitaxially on a textured substrate to achieve improvement of Jc.

MOD process (metal organic deposition process) has been studied as a method for making a tape-shaped Re—Ba—Cu based oxide superconductor film.

MOD process is a method involving pyrolysis of a metal-organic acid salt, in which a uniform solution of a metal-containing organic compound is applied to a substrate and subsequently pyrolyzed to form a thick film on the substrate. The MOD process has advantages of non-vacuum system, high Jc, low cost, and high fabrication speed and is therefore suited to the production of a tape-shaped oxide superconductor.

According to the MOD process, pyrolysis of the starting material (metal-organic acid salt) generally results in the intermediate production of a carbonate of an alkaline earth metal (e.g., Ba). An oxide superconductor is produced through a solid phase reaction of the carbonate. This reaction requires a high temperature treatment at 800° C. or higher. Another significant problem is a reduction in Jc with an increase in film thickness.

To address the above problems, patent documents 1 to 3 listed blow disclose a technique for fabricating an RE-Ba—Cu based oxide superconductor, in which an aliphatic organic acid salt (e.g., an octylate or naphthenate) or a fluorine-containing organic acid salt represented by trifluoroacetic acid is used as a starting material to be calcined and fired.

For example, patent document 3 discloses a composition for thick oxide superconductor film containing a salt of a branched saturated aliphatic carboxylic acid with 6 or more carbon atoms or an alicyclic carboxylic acid with 6 or more carbon atoms as a copper precursor compound; a salt of a branched saturated aliphatic carboxylic acid with 6 or more carbon atoms, an alicyclic carboxylic acid with 6 or more carbon atoms, or a trifluoroacetic acid as an yttrium precursor compound; and barium trifluoroacetate as a barium precursor compound. According to the disclosure, the precursor compounds have good solubility; the composition exhibits excellent coating properties to provide a tape-shaped thick film with uniform thickness and electrical characteristics at a high speed; and a uniform tape-shaped oxide superconductor is obtained at a rate of temperature rise of about 5° C./min in calcination.

In order to establish industrial scale production of continuous length tape, further improvement of production efficiency is needed and, from this viewpoint, it has been demanded to further increase the rate of temperature rise in calcination. If the rate of temperature rise in calcining the composition for a thick oxide superconductor film of patent document 3 is increased, however, the tape would have a larger thickness along edges than in the laterally middle portion, which can result in problems such as non-uniformity of electrical characteristics and crack development.

Patent document 4 discloses a salt of a keto acid, such as acetoacetic acid, propionylbutyric acid, or benzoylformic acid, as an MOD starting material (metal organic acid salt) for an oxide superconductor.

CITATION LIST

Patent Documents

Patent document 1: U.S. Pat. No. 5,231,074A
Patent document 2: US 2002/076567A
Patent document 3: US 2006/043347A
Patent document 4: JP 63-277770A

SUMMARY OF INVENTION

Technical Problem

An object of the invention is to provide a composition for forming a thick oxide superconductor film of an RE-Ba—Cu (RE is at least one element selected from the group consisting of Y, Nd, Sm, Gd, Eu, Yb, Pr, and Ho) based oxide, which composition is suited to the production of an RE-Ba—Cu based oxide superconductor thick film by MOD and capable of high-speed uniform film deposition as well as a process of producing a thick tape-shaped oxide superconductor film using the composition.

Solution to Problem

The inventors of the present invention have found that the above object is accomplished by the use of a salt of a keto acid with 4 to 8 carbon atoms as an RE component.

The invention has been reached based on the above finding. The invention provides a composition for forming an RE-BA-Cu (RE is at least one element selected from the group consisting of Y, Nd, Sm, Gd, Eu, Yb, Pr, and Ho) based oxide superconductor thick film. The composition essentially contains an RE salt of a keto acid having 4 to 8 carbon atoms as an RE component, barium trifluoroacetate as a Ba component, at least one copper salt selected from the group consisting of a copper salt of a branched saturated aliphatic carboxylic acid having 6 to 16 carbon atoms and a copper salt of an alicyclic carboxylic acid having 6 to 16 carbon atoms as a Cu component, and an organic solvent dissolving these metal salt components. In the composition, the RE to Ba to Cu molar ratio is 1:1.3 to 2.2:2.4 to 3.6, and the content of the organic solvent is 25% to 80% by weight.

The invention also provides a process for producing a thick tape-shaped oxide superconductor film. The process includes the steps of applying the composition for forming a thick oxide superconductor film to a substrate, subjecting the applied composition to heat treatment for calcination to form an oxide superconductor precursor on the substrate, and subjecting the oxide superconductor precursor to heat treatment for crystallization to form an RE-Ba—Cu based oxide superconductor thick film on the substrate.

Advantageous Effects of Invention

The composition for forming a thick oxide superconductor film of the invention is suited to produce an RE-Ba—Cu based oxide superconductor thick film by MOD and capable of high-speed uniform film deposition. The composition allows for the fabrication of a thick tape-shaped oxide superconductor film without involving problems, such as cracking, even when the heat treatment for calcination is carried out at a rate of temperature rise of 10° C./min or higher. The thick tape-shaped oxide superconductor film obtained by the process of the invention exhibits good electrical characteristics.

DESCRIPTION OF EMBODIMENTS

The invention will be described in detail.

As used herein, the term "RE-Ba—Cu based oxide superconductor" (wherein RE is at least one element selected from the group consisting of Y, Nd, Sm, Gd, Eu, Yb, Pr, and Ho) denotes a superconductor made of a complex oxide of RE, Ba, and Cu and includes a superconductor having a composition known as $RE_{1+x}Ba_{2-x}Cu_3O_y$, wherein RE is at least one element selected from the group consisting of Y, Nd, Sm, Gd, Eu, Yb, Pr, and Ho; x is a number satisfying the condition $0 \leq x \leq 0.4$; and y is a number satisfying the condition $6.5 \leq y \leq 7.0$. The RE-Ba—Cu based oxide superconductor in which RE is Y is preferred in terms of ease of control of the superconductor composition.

The RE component of the composition for a thick oxide superconductor film of the invention comprises at least one RE salt of a C4-C8 keto acid. The RE salt is represented by $L^1_3RE.mH_2O$, wherein $L^1$ is a residue of a C4-C8 keto acid; RE is Y, Nd, Sm, Gd, Eu, Yb, Pr, or Ho; and m is zero or the number of waters of hydration. The RE salt is generally obtained as an anhydride or a mono- to trihydrate. If the carbon atom number of the keto acid forming an RE salt is fewer than 4, sufficient solubility is not obtained, resulting in a failure to provide a uniform thick oxide superconductor film. If the carbon atom number is greater than 8, sufficient solubility is not obtained, or the metal content of the RE salt is too small, resulting in a reduced metal equivalent concentration. Examples of the keto acid forming the RE salt include acetoacetic acid, benzoylformic acid, levulinic acid, propionylpropanoic acid, butyrylpropanoic acid, and propionylbutyric acid. Keto acids having the ketone group at the γ-position are preferred for their particularly high solubility and good effects on the improvement of the rate of temperature rise. Inter alia, levulinic acid is more preferred for its low price.

The RE component, i.e., the C4-C8 keto acid RE salt, may be synthesized using known reactions. For example, the RE component is obtainable by the reaction between an RE acetate or oxide and the keto acid in a solvent or by the double decomposition reaction between an inorganic RE salt, such as a chloride or a nitrate, and a sodium, potassium, or lithium salt of the keto acid.

The Ba component of the composition for a thick oxide superconductor film of the invention is barium trifluoroacetate represented by $(CF_3COO)_2Ba.nH_2O$ wherein n is zero or the number of waters of hydration. It is generally obtained as an anhydride or a monohydrate. A trifluoroacetate has hitherto been known useful as a precursor compound of an oxide superconductor. The advantage of using a trifluoroacetate resides in that it does not produce a barium carbonate that needs a high temperature for conversion to an oxide superconductor. This advantage can be obtained the most effectively when a Ba component is trifluoroacetate. When a trifluoroacetate is used not as a Ba component but as an RE component, the effects of the invention are not obtained. When it is used as a Cu component, the solubility improving effect hereinafter described is not obtained.

The Cu component of the composition for a thick oxide superconductor film of the invention comprises at least one member selected from the group consisting of a copper salt of a C6-C16 branched saturated aliphatic carboxylic acid and a copper salt of a C6-C16 alicyclic carboxylic acid. The copper salts are represented by $L^2_2Cu.pH_2O$, wherein $L^2$ is a residue of a C6-C16 branched saturated aliphatic carboxylic acid or a residue of a C6-C16 alicyclic carboxylic acid; and p is zero or the number of waters of hydration. It is usually obtained in the form of an anhydride or a mono- or dihydrate. Examples of the C6-C16 branched saturated aliphatic carboxylic acid forming the copper salt include 2-ethylhexanoic acid, isononanoic acid, and neodecanoic acid. Examples of the C6-C16 alicyclic carboxylic acid forming the copper salt include cyclohexanecarboxylic acid, methylcyclohexanecarboxylic acid, and naphthenic acid.

Of these carboxylic acids, those of natural origin, such as naphthenic acid, which may be commercially available, sometimes contain a component having a carbon atom number out of the above specified range or a component having no branch or no alicyclic group. Usually, such commercially available carboxylic acids may be used in the invention whether they contain such an off-specification component.

Copper salts of synthetic carboxylic acids, such as copper neodecanoate, copper 2-ethylhexanoate, and copper isononanoate, are preferred in terms of stable performance and quality. Copper neodecanoate, copper 2-ethylhexanoate, copper isononanoate, and copper naphthenate are preferred; they are not only highly soluble in organic solvents but effective in improving the solubility of the RE salt and the barium salt.

The total content of the RE, Ba, and Cu components in the composition for a thick oxide superconductor film of the invention is preferably 10% to 60%, more preferably 30% to 50%, by weight, and the total molar concentration of the three components is preferably 0.5 to 2.0 mol/L, more preferably 0.7 to 1.5 mol/L. The RE, Ba, and Cu components are present in the composition for a thick oxide superconductor film of the invention at a RE to Ba to Cu molar ratio of 1:1.3 to 2.2:2.4 to 3.6. The molar ratio is selected within the range described as appropriate to the desired RE-Ba—Cu composition.

The organic solvent that can be used in the invention is not particularly limited as long as it is capable of dissolving the RE, Ba, and Cu components and may be chosen as appropriate to desired performance, such as coating performance, dissolving properties, viscosity, and solution stability. Two or more organic solvents may be used in combination.

Usable organic solvents include alcohol solvents, diol solvents, ketone solvents, ester solvents, ether solvents, aliphatic or alicyclic hydrocarbon solvents, aromatic hydrocarbon solvents, cyano-containing hydrocarbon solvents, halogenated aromatic hydrocarbon solvents, and others.

Examples of the alcohol solvents include methanol, ethanol, propanol, isopropanol, 1-butanol, isobutanol, 2-butanol, tert-butanol, pentanol, isopentanol, 2-pentanol, neopentanol, tert-pentanol, hexanol, 2-hexanol, heptanol, 2-heptanol, octanol, 2-ethylhexanol, 2-octanol, cyclopentanol, cyclohexanol, cycloheptanol, methylcyclopentanol, methylcyclohexanol, methylcycloheptanol, benzyl alcohol, ethylene glycol monomethyl ether, ethylene glycol monoethyl ether, propylene glycol monomethyl ether, propylene glycol monoethyl ether, diethylene glycol monomethyl ether, diethylene glycol monoethyl ether, triethylene glycol monomethyl ether, triethylene glycol monoethyl ether, 2-(N,N-dimethylamino)ethanol, and 3-(N,N-dimethylamino)propanol.

Examples of the diol solvents include ethylene glycol, propylene glycol, 1,2-butanediol, 1,3-butanediol, 1,4-butanediol, 1,5-pentanediol, neopentyl glycol, isoprene glycol (3-methyl-1,3-butanediol), 1,2-hexanediol, 1,6-hexanediol, 3-methyl-1,5-pentanediol, 1,2-octanediol, octanediol (2-ethyl-1,3-hexanediol), 2-butyl-2-ethyl-1,3-propanediol, 2,5-dimethyl-2,5-hexanediol, 1,2-cyclohexanediol, 1,4-cyclohexanediol, and 1,4-cyclohexanedimethanol.

Examples of the ketone solvents include acetone, methyl ethyl ketone, methyl isopropyl ketone, methyl butyl ketone, methyl isobutyl ketone, methyl amyl ketone, methyl hexyl ketone, ethyl butyl ketone, diethyl ketone, dipropyl ketone, diisobutyl ketone, methyl amyl ketone, cyclohexanone, and methylcyclohexanone.

Examples of the ester solvents include methyl formate, ethyl formate, methyl acetate, ethyl acetate, isopropyl acetate, butyl acetate, isobutyl acetate, sec-butyl acetate, tert-butyl acetate, amyl acetate, isoamyl acetate, tert-amyl acetate, phenyl acetate, methyl propionate, ethyl propionate, isopropyl propionate, butyl propionate, isobutyl propionate, sec-butyl propionate, tert-butyl propionate, amyl propionate, isoamyl propionate, tert-amyl propionate, phenyl propionate, methyl 2-ethylhexanoate, ethyl 2-ethylhexanoate, propyl 2-ethylhexanoate, isopropyl 2-ethylhexanoate, butyl 2-ethylhexanoate, methyl lactate, ethyl lactate, methyl methoxypropionate, methyl ethoxypropionate, ethyl methoxypropionate, ethyl ethoxypropionate, ethylene glycol monomethyl ether acetate, diethylene glycol monomethyl ether acetate, ethylene glycol monoethyl ether acetate, ethylene glycol monopropyl ether acetate, ethylene glycol monoisopropyl ether acetate, ethylene glycol monobutyl ether acetate, ethylene glycol mono-sec-butyl ether acetate, ethylene glycol monoisobutyl ether acetate, ethylene glycol mono-tert-butyl ether acetate, propylene glycol monomethyl ether acetate, propylene glycol monoethyl ether acetate, propylene glycol monopropyl ether acetate, propylene glycol monoisopropyol ether acetate, propylene glycol monobutyl ether acetate, propylene glycol mono-sec-butyl ether acetate, propylene glycol monoisobutyl ether acetate, propylene glycol mono-tert-butyl ether acetate, butylene glycol monomethyl ether acetate, butylene glycol monoethyl ether acetate, butylene glycol monopropyl ether acetate, butylene glycol monoisopropyl ether acetate, butylene glycol monobutyl ether acetate, butylene glycol mono-sec-butyl ether acetate, butylene glycol monoisobutyl ether acetate, butylene glycol mono-tert-butyl ether acetate, methyl acetoacetate, ethyl acetoacetate, methyl oxobutanoate, ethyl oxobutanoate, γ-lactone, dimethyl malonate, dimethyl succinate, propylene glycol diacetate, and δ-lactone.

Examples of the ether solvents include tetrahydrofuran, tetrahydropyran, morpholine, ethylene glycol dimethyl ether, diethylene glycol dimethyl ether, dipropylene glycol dimethyl ether, triethylene glycol dimethyl ether, dibutyl ether, diethyl ether, and dioxane.

Examples of the aliphatic or alicyclic hydrocarbon solvents include pentane, hexane, cyclohexane, methylcyclohexane, dimethylcyclohexane, ethylcyclohexane, heptane, octane, decaline, solvent naphtha, terpene oil, D-limonene, pinene, mineral spirit, Swasol 310 (from Cosmo Matsuyama Oil), and Solvesso 100 (from Exxon Chemical).

Examples of the aromatic hydrocarbon solvents include benzene, toluene, ethylbenzene, xylene, mesitylene, diethylbenzene, cumene, isobutylbenzene, cymene, and tetralin.

Examples of the cyano-containing hydrocarbon solvents include acetonitrile, 1-cyanopropane, 1-cyanobutane, 1-cyanohexane, cyanocyclohexane, cyanobenzene, 1,3-dicyanopropane, 1,4-dicyanobutane, 1,6-dicyanohexane, 1,4-dicyanocyclohexane, and 1,4-dicyanobenzene.

Examples of the halogenated hydrocarbon solvents include carbon tetrachloride, chloroform, trichloroethylene, and methylene chloride.

The other organic solvents include N-methyl-2-pyrrolidone, dimethyl sulfoxide, dimethylformamide, aniline, triethylamine, and pyridine.

Of these organic solvents, those having a boiling point of 80° C. or higher are preferable in terms of providing uniform coating properties. The alcohol solvents are preferred for their good wetting on various substrates. Particularly suitable are alcohol solvents with 4 to 8 carbon atoms, such as 1-butanol, isobutanol, 2-butanol, tert-butanol, pentanol, isopentanol, 2-pentanol, neopentanol, tert-pentanol, hexanol, 2-hexanol, heptanol, 2-heptanol, octanol, 2-ethylhexanol, 2-octanol, ethylene glycol monoethyl ether, propylene glycol monomethyl ether, propylene glycol monoethyl ether, and diethylene glycol monomethyl ether.

The content of the organic solvent in the composition for a thick oxide superconductor film of the invention is 25% to 80% by weight. It is preferably 40% to 70% by weight in view of coating properties, concentration of the metal components, and solution stability.

If desired, the composition for a thick oxide superconductor film of the invention may further contain optional components, such as a solubilizer, a leveling agent, a thickener, a stabilizer, a surfactant, and a dispersant. The content of these optional components in the composition for a thick oxide superconducting film of the invention is preferably not more than 10% by weight.

The optional components are exemplified by organic acids that function as a solubilizer and a leveling agent. Such organic acids are preferably C6-C30 organic acids optionally having a hydroxyl group, a branched structure, and/or an unsaturated bond. Examples of the organic acids are 2-ethylhexanoic acid, isononanoic acid, neodecanoic acid, undecanoic acid, lauric acid, tridecanoic acid, myristic acid, pentadecanoic acid, palmitic acid, margaric acid, stearic acid, nonadecanoic acid, arachidic acid, behenic acid, lignoceric acid, cerotic acid, montanic acid, melissic acid, obtusilic acid, linderic acid, tsuzuic acid, palmitoleic acid, petroselinic acid, oleic acid, elaidic acid, vaccenic acid, linolic acid, linoelaidic acid, γ-linolenic acid, linolenic acid, ricinoleic acid, 12-hydroxystearic acid, cyclohexanecarboxylic acid, methylcyclohexanecarboxylic acid, naphthenic acid, rosin acid, and abietic acid, with abietic acid being preferred.

The viscosity of the composition for a thick oxide superconductor film of the invention is not particularly limited and may be selected appropriately according to the coating method. When a coating method requiring a coating solution to be flowable, such as spin coating, dip coating, or brush coating, is chosen, the viscosity is desirably in the range of from 10 to 50 mPa·s.

The process for forming a thick tape-shaped RE-Ba—Cu based oxide superconductor film using the aforementioned composition for a thick oxide superconductor film of the invention will then be described. The thick tape-shaped oxide superconductor film is produced by using the composition for a thick oxide superconductor film of the invention in accordance with the conventional MOD technique.

In the first step of the production of a thick tape-shaped oxide superconductor film according to the invention, the composition for a thick oxide superconductor film of the invention is applied to a substrate.

The substrate, which is not particularly limited, is appropriately selected from known substrates that permit the formation of a thick oxide superconductor film thereon by the wet deposition process, including metal tape and metal tape having an intermediate layer. The size of the substrate is not particularly limited and is selected as appropriate to the intended use of the oxide superconductor. For example, the substrate may measure 1 to 100 mm in width, 0.05 to 3 mm in thickness, and 0.1 to 1000 m in length.

The substrate may be a single crystal substrate or a polycrystalline substrate. The single crystal substrate is exemplified by $LaAlO_3$ (100) single crystal substrate (LAO single crystal substrate). The polycrystalline substrate is exemplified by a textured Ni substrate and a composite substrate obtained by ion beam assisted deposition (IBAD).

The method of coating the substrate with the composition for a thick oxide superconductor film of the invention is not particularly limited and may be selected appropriately from known coating methods conventionally employed in the formation of a thick oxide superconductor film by wet deposition, such as dip coating and brush coating. Dip coating is preferred. In the dip coating, the traveling speed of the substrate is preferably in the range of from 5 to 30 m/hr.

The composition for a thick oxide superconductor film applied on the substrate is then subjected to heat treatment for calcination to obtain an oxide superconductor precursor. Preferred conditions of the heat treatment for calcination will be described hereunder.

Using the composition for a thick oxide superconductor film of the invention allows for increasing the rate of temperature rise in the heat treatment for calcination, thereby to form a thick tape-shaped oxide superconductor film at a higher speed. When a conventionally known composition for an RE-Ba—Cu based oxide superconductor thick film is used, the rate of temperature rise in calcination is usually about 5° C./min. The rate is allowed to be increased to 10° C./min or even higher by the use of the composition of the invention. In the process of the invention, the rate of temperature rise is preferably 20° C./min or higher. The upper limit of the rate is not particularly limited as long as film formation is possible but is usually about 40° C./min.

The heat treatment for calcination is preferably carried out at a temperature of 250° C. or higher, more preferably 300° to 500° C., in an atmosphere having a water vapor content of 2.1 vol % or less, more preferably 0.1 to 1.0 vol %.

It is possible to increase the product of the traveling speed of the substrate and the temperature gradient in the heat treatment for calcination, which allows the formation of a thick tape-shaped oxide superconductor film in a small-sized electric oven. The product of the substrate traveling speed and the temperature gradient is preferably 2° C./min or greater, more preferably 5° C./min or greater. The upper limit of the product is not particularly limited as long as film formation is possible but is usually about 10° to 50° C./min.

If necessary, the operation of coating followed by heat treatment for calcination may be repeated twice or more times so as to provide an oxide superconductor having a desired thickness.

The thus obtained oxide superconductor precursor is then subjected to heat treatment for crystallization to give a thick tape-shaped RE-Ba—Cu based oxide superconductor composed of the substrate and a thick oxide superconductor film. The heat treatment for crystallization may be performed in a usual manner. For example, the heat treatment is preferably carried out at a temperature ranging from 725° to 775° C. in an atmosphere with a water vapor content of 2.1 to 20 vol %. The heat treatment is preferably carried out for 1 to 5 hours.

The above described process provides a thick tape-shaped oxide superconductor film with a uniform thickness. The thickness of the thick tape-shaped oxide superconductor film is not particularly limited and is selected appropriately according to the intended use. The thickness is usually in the range of from 0.5 to 10 μm. The difference between the maximum thickness and the minimum thickness is preferably within 1 μm, more preferably 0.5 μm or less.

In the process of producing a thick tape-shaped oxide superconductor film of the invention, the step of heat treatment for crystallization allows for reducing the variation in critical current density. The variation of critical current density is preferably in the range of $\pm 0.5$ $MA/cm^2$.

Applications of the thick tape-shaped oxide superconductor film obtained by the process of the invention include wires, devices, and electrical equipment, such as power cables, transformers, and fault current limiters.

EXAMPLES

The invention will now be illustrated in greater detail with reference to Examples, but it should be understood that the invention is not construed as being limited thereto. Unless otherwise noted, all the percents are by mass.

Synthesis Example 1

Preparation of Yttrium Levulinate

A 2-liter reaction flask was charged with 202.9 g of yttrium acetate tetrahydrate, and 500 g of water and 240 g of ethanol were added thereto. To the mixture was added 229.92 g of levulinic acid while stirring, and the mixture was stirred at 50° C. for 2 hours. The resulting solution was concentrated by gradually evacuating the system. The resulting liquid was taken out in a nitrogen stream to obtain 280 g (yield: 99%) of a viscous liquid, which was identified to be yttrium levulinate as a result of IR analysis, yttrium content determination (titration using EDTA), and differential thermal analysis (DTA) in air. The results of the analyses are shown below.

Results of Analyses:

IR absorption ($cm^{-1}$): 3100, 2666, 1715, 1409, 1402, 1369, 1208, 1165, 1054, 1022, 988, 930, 800, 771, 661, 612, 571, 505, 500

Yttrium content: 18.3% (theoretical value: 20.47%)

DTA (from 30° to 600° C., 10° C./min): 510° C. (−79%; yttrium oxide)

Example 1

Preparation of Composition for Thick Oxide Superconductor Film

Ethylene glycol monoethyl ether and 1-pentyl alcohol were mixed at a volume ratio of 2:1 to prepare a mixed solvent. The mixed solvent, the yttrium levulinate obtained in Synthesis Example 1, barium trifluoroacetate, copper octylate, and abietic acid were mixed to prepare a uniform solution containing a total of 42.5% of the three metal salts, 52% of the mixed solvent, and 5.5% of abietic acid, which was a composition for a thick oxide superconductor film. The three metal salts were used at a Y to Ba to Cu molar ratio of 1:1.5:3.05. The resulting composition, designated composition No. 1, had a viscosity of 34 mPa·s (25° C.).

Comparative Example 1

Preparation of Comparative Composition for Thick Oxide Superconductor Film

The same mixed solvent as used in Example 1, yttrium trifluoroacetate, barium trifluoroacetate, copper octylate, and abietic acid were mixed to prepare a uniform solution containing a total of 42.5% of the three metal salts, 52% of the mixed solvent, and 5.5% of abietic acid, which was a comparative composition for a thick oxide superconductor film. The three metal salts were used at a Y to Ba to Cu molar ratio of 1:1.5:3.05. The resulting composition, designated comparative composition No. 1, had a viscosity of 30 mPa·s (25° C.).

Evaluation Example 1

On Hastelloy tape measuring 10 m in length, 10 mm in width, and 0.1 mm in thickness was deposited $Zr_2Gd_2O_7$ by IBAD to form a 1 μm thick, first intermediate layer. On the first intermediate layer was further deposited $CeO_2$ by sputtering to form a 0.5 μm thick second intermediate layer, thereby to make an IBAD composite substrate having a Hastelloy/$Zr_2Gd_2O_7$/$CeO_2$ structure. The substrate was cut to 10 mm length to provide a substrate for testing.

Composition No. 1 obtained in Example 1 or comparative composition No. 1 obtained in Comparative Example 1 (see Table 1 below) was applied to the substrate for testing by spin coating under the conditions described below.

The applied composition was calcined by heating at a rate of 5° C./min or 25° C./min (see Table 1) up to 500° C. in an atmosphere having a water vapor content of 2.1 vol % and an oxygen content of 97.9 vol %, followed by furnace cooling in an atmosphere having an oxygen concentration of 100%. The steps of application and calcination were repeated six times in the same manner as described to obtain a Y—Ba—Cu precursor.

The Y—Ba—Cu precursor was heated at a rate of 5° C./min up to a substrate temperature of 750° C. and fired at that temperature for 1 to 3 hours in an atmosphere having a water vapor content of 6.3 vol % and an oxygen content of 93.7 vol %. Subsequently, the furnace was flushed with dry gas and kept as such for 10 minutes to complete heat treatment for crystallization, followed by furnace cooling to obtain a thick tape-shaped oxide superconductor film.

Silver was vapor-deposited on the thick tape-shaped oxide superconductor film to make an electrode, which was then heat treated at 450° C. for 1 hour in an oxygen atmosphere to prepare a sample for evaluation. The Jc of the sample was determined in liquid nitrogen. The results are shown in Table 1.

Spin Coating Conditions:
　Amount of composition cast on substrate: 0.2 ml
　Spin coating program: 2500 rpm, 90 seconds

TABLE 1

|  | Rate of Temperature Rise in Calcination (° C./min) | Film Thickness (μm) | Jc (MA/cm²) |
|---|---|---|---|
| Composition No. 1 | 5 | 1.03 | 2.46 |
| Composition No. 1 | 25 | 1.19 | 2.61 |
| Comp. Composition No. 1 | 5 | 1.54 | 2.64 |
| Comp. Composition No. 1 | 25 | 1.49 | 1.74 |

The results in Table 1 prove that composition No. 1, which is a composition for a thick oxide superconductor film of the invention, provides a thick oxide superconductor film with no reduction of Jc, the electrical characteristic of the superconductor film, even when calcined at a rate of 25° C./min. In contrast, comparative composition No. 1 shows a reduction in Jc when calcined at a rate of 25° C./min.

Example 2

Making of Thick Tape-Shaped Oxide Superconductor Film

An IBAD composite substrate having a Hastelloy/$Zr_2Gd_2O_7$/$CeO_2$ structure was used as a substrate. The IBAD composite substrate was prepared by depositing $Zr_2Gd_2O_7$ by IBAD on Hastelloy tape measuring 10 m in length, 10 mm in width, and 0.1 mm in thickness to form a 1 μm thick, first intermediate layer and sputtering $CeO_2$ onto the first intermediate layer to form a 0.5 μm thick second intermediate layer.

Composition No. 1 was applied to the IBAD composite substrate by dip coating at the traveling speed (of the substrate) shown in Table 2 and calcined by heating at the rate of temperature rise shown in Table 2 up to 500° C. in an atmosphere having a water vapor content of 2.1 vol % and an oxygen content of 97.9 vol %, followed by furnace cooling in an atmosphere having an oxygen concentration of 100% to obtain a Y—Ba—Cu precursor.

The Y—Ba—Cu precursor was heated at a rate of 5° C./min up to a substrate temperature of 750° C. and fired at that temperature for 1 to 3 hours in an atmosphere having a water vapor content of 6.3 vol % and an oxygen content of 93.7 vol %. Subsequently, the furnace was flushed with dry gas and kept as such for 10 minutes to complete heat treatment for crystallization, followed by furnace cooling to obtain a thick tape-shaped oxide superconductor film.

Silver was vapor-deposited on the thick tape-shaped oxide superconductor film to make an electrode, which was then heat treated at 450° C. for 1 hour in an oxygen atmosphere to prepare a sample for evaluation. The film thickness at the lateral center was measured, and the tape was inspected for cracking along its edges. The results obtained are shown in Table 2.

Comparative Example 2

Making of Comparative Thick Tape-Shaped Oxide Superconductor Film

A comparative thick tape-shaped oxide superconductor film was made in the same manner as in Example 2, except for using comparative composition No. 1 as a composition for a thick oxide superconductor film. Film thickness determination and crack inspection were conducted. The results are shown in Table 2.

TABLE 2

| Composition for Thick Oxide Superconductor Film | Traveling Speed (m/hr) | Rate of Temperature Rise in Calcination (° C./min) | Film Thickness (μm) | Cracking |
|---|---|---|---|---|
| Example 2-1 composition No. 1 | 2.0 | 4.0 | 0.20 | no |
| Example 2-2 composition No. 1 | 5.0 | 10 | 0.38 | no |
| Example 2-3 composition No. 1 | 7.0 | 14 | 0.47 | no |
| Example 2-4 composition No. 1 | 10 | 20 | 0.56 | no |
| Comp. Example 2-1 comp. composition No. 1 | 1.2 | 2.4 | 0.26 | no |
| Comp. Example 2-2 comp. composition No. 1 | 1.7 | 3.7 | 0.30 | no |
| Comp. Example 2-3 comp. composition No. 1 | 2.4 | 4.8 | 0.32 | yes |
| Comp. Example 2-4 comp. composition No. 1 | 3.7 | 7.4 | 0.36 | yes |

Table 2 prove that composition No. 1, which is the composition for a thick oxide superconductor film of the invention, allows for increasing the traveling speed thereby to bring about improved productivity. In Example 2-4, for example, a crack-free thick film with a thickness of 0.56 μm was obtained at a traveling speed of 10 m/hr and a rate of temperature rise of 20° C./min. In using the comparative composition, in contrast, the improvement on productivity is limited because increasing the traveling speed results in crack development along the tape edges. For example, in Comparative Example 2-3, although a thick film with a thickness of 0.32 μm was obtained at a traveling speed of 2.4 m/hr and a rate of temperature rise of 4.8° C./min, the tape suffered from cracking along its edges.

Example 3

Making of Thick Tape-Shaped Oxide Superconductor Film

Composition No. 1 prepared in Example 1 was diluted with the same mixed solvent as used in Example 1 (i.e., a 2:1 by volume mixture of ethylene glycol monoethyl ether and 1-pentyl alcohol) to prepare composition No. 2 having a viscosity of 15 mPa·s (25° C.). Composition No. 2 contained a total of 39% of the three metal salts, 55.5% of the mixed solvent, and 5.5% by abietic acid. The total content (on a molar base) of the metals, Y, Ba, and Cu, was 1.1 mol per liter.

Composition No. 2 was applied to the same IBAD composite substrate as used in Example 2, except for measuring 20 m in length, by dip coating at a traveling speed of 10 m/hr and calcined by heating at a rate of temperature rise of 20° C./min up to 450° C. in an atmosphere having a water vapor content of 2.1 vol % and an oxygen content of 97.9 vol %, followed by furnace cooling in an atmosphere having an oxygen concentration of 100%. The steps of application and calcination were repeated six times in the same manner as described to obtain a Y—Ba—Cu precursor.

The Y—Ba—Cu precursor was heated at a rate of 5° C./min up to a substrate temperature of 760° C. and fired at that temperature for 1 hour in an atmosphere having a water vapor content of 13.4 vol % and an oxygen content of 0.1 vol %. Subsequently, the furnace was flushed with dry gas and kept as such for 10 minutes to complete heat treatment for crystallization, followed by furnace cooling to obtain a thick tape-shaped oxide superconductor film having a film thickness of 1.55 μm.

Silver was vapor-deposited on the thick tape-shaped oxide superconductor film to make an electrode, which was then heat treated at 450° C. for 1 hour in an oxygen atmosphere to prepare a sample. The Ic and Jc values of the sample were measured by the four-point probe method with a voltage criterion of 1 μV/cm. As a result, the 10 m long tape was found to have an Ic of 225 A/cm-width and a Jc of 1.45 MA/cm$^2$.

Example 3 proves that a continuous thick tape-shaped oxide superconductor film is produced even under highly productive conditions, i.e., a traveling speed of 10 m/hr and a rate of temperature rise of 20° C./min.

The invention claimed is:

1. A composition for forming a thick oxide superconductor film, the oxide being an RE-BA-Cu based oxide, wherein RE is at least one element selected from the group consisting of Y, Nd, Sm, Gd, Eu, Yb, Pr, and Ho,
    the composition comprising an RE salt of a keto acid having 4 to 8 carbon atoms as an RE component, barium trifluoroacetate as a Ba component, at least one copper salt selected from the group consisting of a copper salt of a branched saturated aliphatic carboxylic acid having 6 to 16 carbon atoms and a copper salt of an alicyclic carboxylic acid having 6 to 16 carbon atoms as a Cu component, and an organic solvent dissolving these metal salt components,
    the RE to Ba to Cu molar ratio being 1:1.3 to 2.2:2.4 to 3.6, and
    the content of the organic solvent being 25% to 80% by weight.

2. The composition for forming a thick oxide superconductor film according to claim 1, wherein the RE component comprises an yttrium salt of a keto acid having 4 to 8 carbon atoms.

3. The composition for forming a thick oxide superconductor film according to claim 1, wherein the RE component comprises an RE salt of a keto acid having the ketone group at the γ-position thereof.

4. The composition for forming a thick oxide superconductor film according to claim 1, wherein the organic solvent comprises an alcohol solvent having 4 to 8 carbon atoms.

5. A process for producing a thick tape-shaped oxide superconductor film, comprising the steps of applying the composition for forming a thick oxide superconductor film according to claim 1 to a substrate, subjecting the applied composition to heat treatment for calcination to form an oxide superconductor precursor on the substrate, and subjecting the oxide superconductor precursor to heat treatment for crystallization to form an RE-Ba—Cu based oxide superconductor thick film on the substrate.

6. The process for producing a thick tape-shaped oxide superconductor film according to claim 5, wherein the heat treatment for calcination is carried out at a rate of temperature rise of 10° C./min or higher.

7. The composition for forming a thick oxide superconductor film according to claim 2, wherein the RE component comprises an RE salt of a keto acid having the ketone group at the γ-position thereof.

8. The composition for forming a thick oxide superconductor film according to claim 2, wherein the organic solvent comprises an alcohol solvent having 4 to 8 carbon atoms.

9. The composition for forming a thick oxide superconductor film according to claim 3, wherein the organic solvent comprises an alcohol solvent having 4 to 8 carbon atoms.

10. A process for producing a thick tape-shaped oxide superconductor film, comprising the steps of applying the composition for forming a thick oxide superconductor film according to claim 2 to a substrate, subjecting the applied composition to heat treatment for calcination to form an oxide superconductor precursor on the substrate, and subjecting the oxide superconductor precursor to heat treatment for crystallization to form an RE-Ba—Cu based oxide superconductor thick film on the substrate.

11. A process for producing a thick tape-shaped oxide superconductor film, comprising the steps of applying the composition for forming a thick oxide superconductor film according to claim 3 to a substrate, subjecting the applied composition to heat treatment for calcination to form an oxide superconductor precursor on the substrate, and subjecting the oxide superconductor precursor to heat treatment for crystallization to form an RE-Ba—Cu based oxide superconductor thick film on the substrate.

12. A process for producing a thick tape-shaped oxide superconductor film, comprising the steps of applying the composition for forming a thick oxide superconductor film according to claim 4 to a substrate, subjecting the applied composition to heat treatment for calcination to form an oxide superconductor precursor on the substrate, and subjecting the oxide superconductor precursor to heat treatment for crystallization to form an RE-Ba—Cu based oxide superconductor thick film on the substrate.

13. The composition for forming a thick oxide superconductor film according to claim 7, wherein the organic solvent comprises an alcohol solvent having 4 to 8 carbon atoms.

14. A process for producing a thick tape-shaped oxide superconductor film, comprising the steps of applying the composition for forming a thick oxide superconductor film according to claim 7 to a substrate, subjecting the applied composition to heat treatment for calcination to form an oxide superconductor precursor on the substrate, and subjecting the oxide superconductor precursor to heat treatment for crystallization to form an RE-Ba—Cu based oxide superconductor thick film on the substrate.

15. A process for producing a thick tape-shaped oxide superconductor film, comprising the steps of applying the composition for forming a thick oxide superconductor film according to claim 8 to a substrate, subjecting the applied composition to heat treatment for calcination to form an oxide superconductor precursor on the substrate, and subjecting the oxide superconductor precursor to heat treatment for crystallization to form an RE-Ba—Cu based oxide superconductor thick film on the substrate.

16. A process for producing a thick tape-shaped oxide superconductor film, comprising the steps of applying the composition for forming a thick oxide superconductor film according to claim 9 to a substrate, subjecting the applied composition to heat treatment for calcination to form an oxide superconductor precursor on the substrate, and subjecting the oxide superconductor precursor to heat treatment for crystallization to form an RE-Ba—Cu based oxide superconductor thick film on the substrate.

17. A process for producing a thick tape-shaped oxide superconductor film, comprising the steps of applying the composition for forming a thick oxide superconductor film according to claim 13 to a substrate, subjecting the applied composition to heat treatment for calcination to form an oxide superconductor precursor on the substrate, and subjecting the oxide superconductor precursor to heat treatment for crystallization to form an RE-Ba—Cu based oxide superconductor thick film on the substrate.

\* \* \* \* \*